United States Patent
Yeh et al.

(10) Patent No.: US 6,365,468 B1
(45) Date of Patent: Apr. 2, 2002

(54) METHOD FOR FORMING DOPED P-TYPE GATE WITH ANTI-REFLECTION LAYER

(75) Inventors: Wen-Kuan Yeh, Chu Pei; Tony Lin, Hsin-Chu; Chih-Yung Lin, Taichung, all of (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/598,192

(22) Filed: Jun. 21, 2000

(51) Int. Cl.[7] .................. H01L 21/336; H01L 21/76
(52) U.S. Cl. .................. 438/295; 438/296; 438/303; 438/414
(58) Field of Search .................. 438/295, 296, 438/414, 303, 197, 231

(56) References Cited

U.S. PATENT DOCUMENTS

| | | | | |
|---|---|---|---|---|
| 5,897,349 A | * | 4/1999 | Agnello | 438/230 |
| 6,004,861 A | * | 12/1999 | Gardner et al. | 438/414 |
| 6,093,611 A | * | 7/2000 | Gardner et al. | 438/295 |
| 6,187,644 B1 | * | 2/2001 | Lin et al. | 438/303 |

* cited by examiner

*Primary Examiner*—John F. Niebling
*Assistant Examiner*—Walter Lindsay, Jr.
(74) *Attorney, Agent, or Firm*—Powell, Goldstein, Frazer & Murphy LLP

(57) ABSTRACT

A method for forming doped p-type gate is disclosed as the following description. The method includes that, firstly, a semiconductor substrate is provided. The semiconductor substrate is etched to form a concave portion as a shallow trench isolation. A first silicon dioxide is filled into the shallow trench isolation. A n-type well is formed into the semiconductor substrate. A silicon germanium layer, named as the doped p-type layer is formed on the surface of semiconductor substrate and the surface of shallow trench isolation. A silicon nitride layer, named as the anti-reflection layer is formed on the surface of silicon germanium layer. The portions of silicon nitride layer and the portions of silicon germanium layer are etched as a gate region. The source/drain extension is formed. A second silicon dioxide layer is deposited over the surface of semiconductor substrate and the surface of nitride layer. The second silicon dioxide layer is etched as a spacer beside the sidewall of gate region. A source/drain region is formed into the semiconductor substrate. The silicon nitride layer is removed. Finally, salicide region is formed into the source/drain region and upon the surface of silcion layer to complete the silicon gate structure.

15 Claims, 7 Drawing Sheets

METHOD FOR FORMING DOPED P-TYPE GATE WITH ANTI-REFLECTION LAYER

BACKGROUND OF THE INVENTION

1. Field of the Invention

The invention relates the formation of doped p-type gate, more particularly forming doped p-type gate with removed anti-reflection layer.

2. Description of the Prior Art

Scaling of CMOS technology to the deep sub-micron regime has been driven by the need for higher speed and integration density, as well as lower power operation. Also, dual gate technology offers several advantages, including reduced short channel effect by the surface channel operation of both NMOS and PMOS device, low and symmetric threshold voltages required for low supply voltages.

However, new problem such as the poly-gate-depletion effect (PDE) emerges as the dimensions of devices enter the deep submicron regime is very difficult to be controlled for conventional polysilicon type gate CMOS.

Therefore, due to the conventional polysilicon gate has no close-to-midgap work function, so device process need to be modified by a much more fabrication.

SUMMARY OF THE INVENTION

In accordance with the present invention, a method is provided for forming doped p-type gate that substantially achieves close-midgap work function.

In the preferred embodiment, with the disposable silicon nitride film which can be removed, pure $p^+$ doped single gate can be obtained without $n^+$ implantation dose compensate problem happened for CMOS device.

In the preferred embodiment, the height of polysilicon gate was lower than oxide spacer, good salicidation can be formed for polysilicon gate, by the way, source/drain to gate bridging for salicidation can be suppressed.

In the preferred embodiment, the silicon nitride film can be the anti-reflection layer. Thus, the critical dimension control of polysilicon gate can be efficiently improved.

In the preferred embodiment, the process is compatible with the conventional technology for the sub-0.13 um device design.

In the preferred embodiment, firstly, a semiconductor substrate is provided. A first photoresist is formed on the surface of semiconductor substrate. The semiconductor substrate is etched to form a concave portion as a shallow trench isolation. The first photoresist is removed. A first silicon dioxide is filled into the shallow trench isolation. A n-type well is formed into the semiconductor substrate. A silicon germanium layer, also named as doped p-type layer is formed on the surface of semiconductor substrate and the surface of shallow trench isolation. A silicon nitride layer is formed on the surface of silicon germanium layer. A second photoresist is formed on the surface the silicon nitride layer, also named as anti-reflection layer. The portions of silicon nitride layer and the portions of silicon germanium layer are etched as a gate region. Then the second photoresist is removed. The source/drain extension is formed. A second silicon dioxide layer is deposited over the surface of semiconductor substrate and the surface of nitride layer. The second silicon dioxide layer is etched as a spacer beside the sidewall of gate region. A source/drain region is formed into the semiconductor substrate by implantation using the gate region and the spacer as a mask. The silicon nitride layer is removed. Finally, salicide region is formed into the source/drain region and upon the surface of silcion layer to complete the silicon gate structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The following is a description of the present invention. The invention will firstly be described with reference to one exemplary structure. Some variations will then be described as well as advantages of the present invention. A preferred method of fabrication will then be discussed.

Moreover, while the present invention is illustrated by a number of preferred embodiments directed to silicon germanium gate, it is not intended that these illustrations be a limitation on the scope or applicability of the present invention. Further, while the illustrative examples use silicon germanium, it should be recognized that the insulated gate portions may be replaced with other materials. Thus, it is not intended that the semiconductor devices of the present invention be limited to the structures illustrated. These devices are included to demonstrate the utility and application of the present invention to presently preferred embodiments.

The spirit of the proposed invention can be explained and understood by the following embodiments with corresponding figures. With reference to FIGS. 1A to 1M, also, the method according to the present invention is schematically shown to be noted here that substrate 11 in FIGS. 1A to 1M.

Figure 1A:
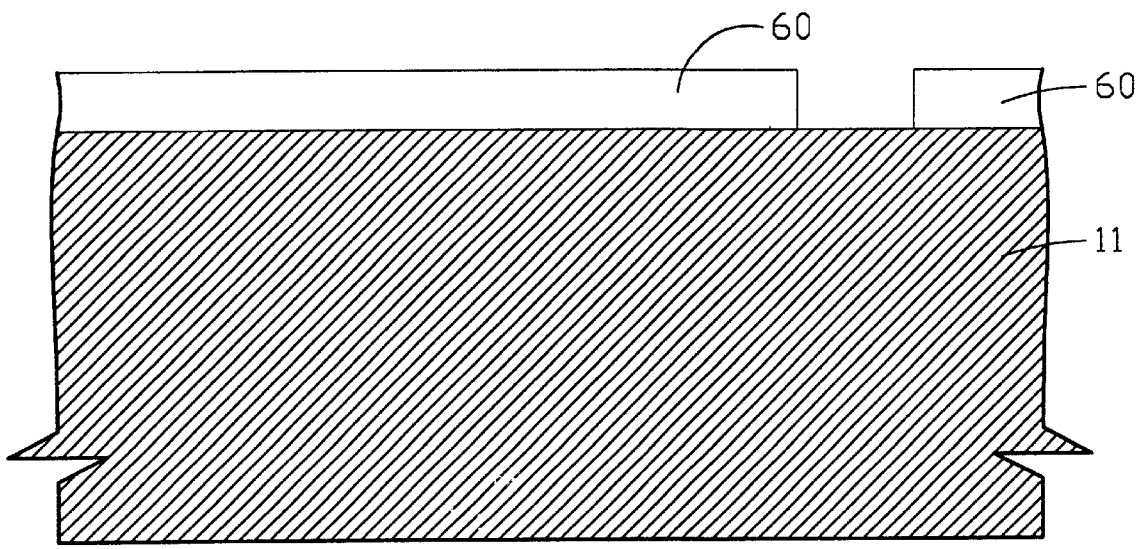
FIGS. 1A to 1M are illustrative of various components in the structure with first embodiment of the present invention.

In the preferred embodiment, as FIG. 1A, a semiconductor substrate 11 is provided. A first photoresist 60 is formed by the conventional lithography on the surface of semiconductor substrate 11.

Figure 1B:
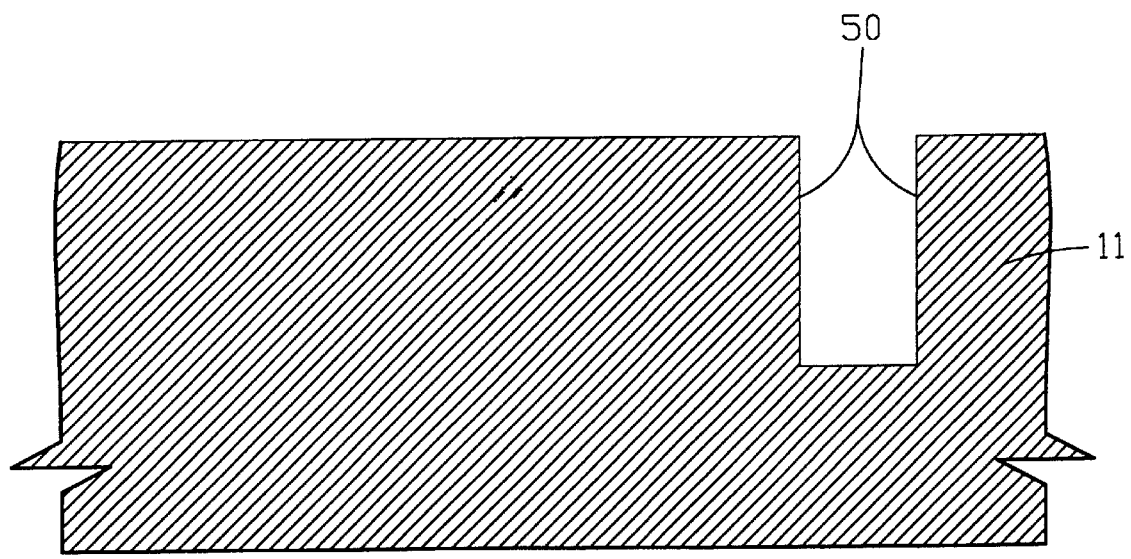

As FIG. 1B, the semiconductor substrate 11 is etched by the conventional dry plasma etching to form a concave portion 50 as a shallow trench isolation. Then, the photoresist 60 is removed by the conventional plasma dry etching.

Figure 1C:
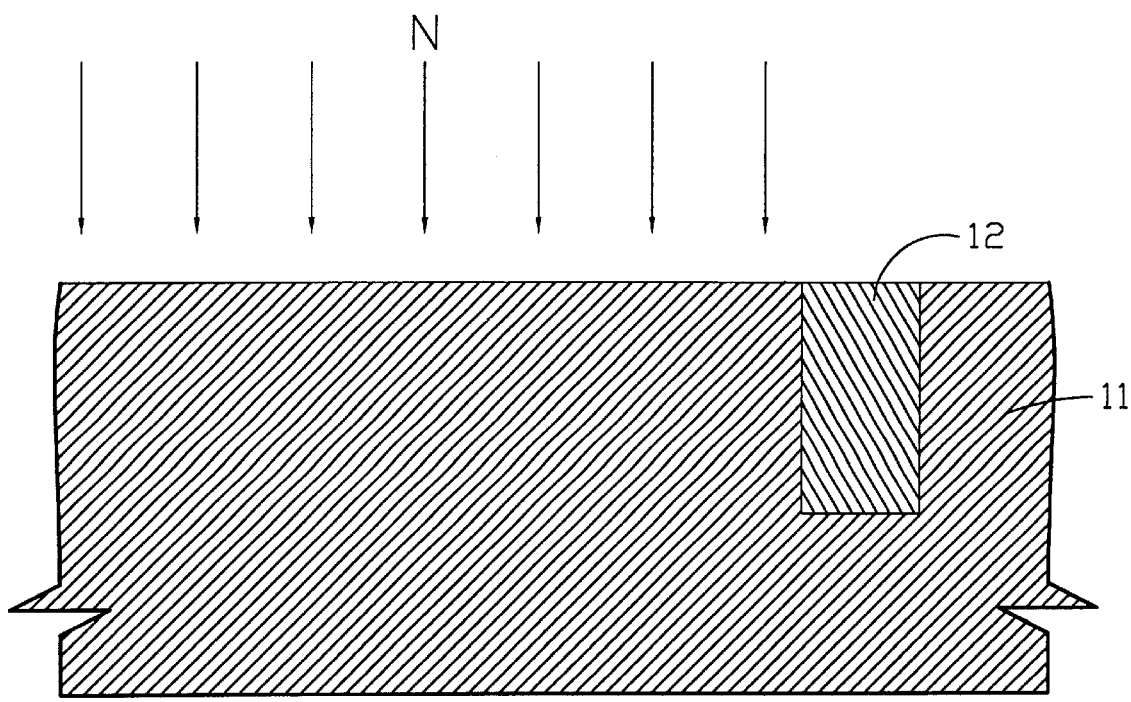

As FIG. 1C, first silicon dioxide 12 is filled into the shallow trench isolation 12 by the conventional chemical vapor deposition. The formation temperature is about 400° C. to 450° C. and the formation pressure is about few torrs. Then, an n-type well is formed into the semiconductor substrate 11 using the conventional implanting.

Figure 1D:
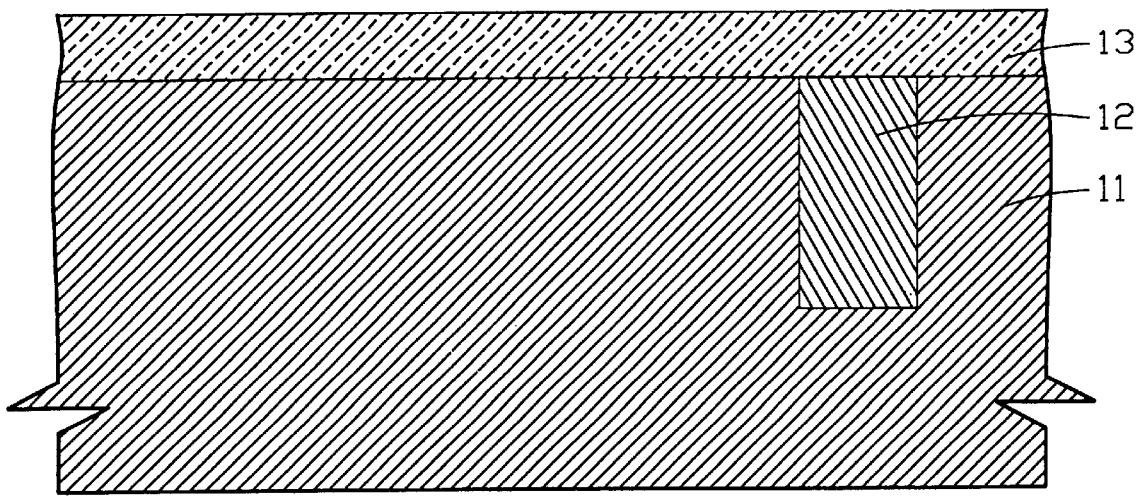

As FIG. 1D, the silicon germanium layer 13, also named as doped p-type layer is formed using the chemical vapor deposition on the surface of semiconductor substrate 11 and the surface of the shallow trench isolation 12. The formation temperature of this silicon germanium layer 13 is about 400° C. to 450° C. and the formation pressure is about few torrs. This silicon germanium is a kind of $p^+$ doped poly-SiGe, which can be formed by in-situ $p^+$ doped poly-SiGe growth process or by post p+ implantation process. The depth of the silicon germanium layer 13 is about 1000~2000 angstroms.

Figure 1E:
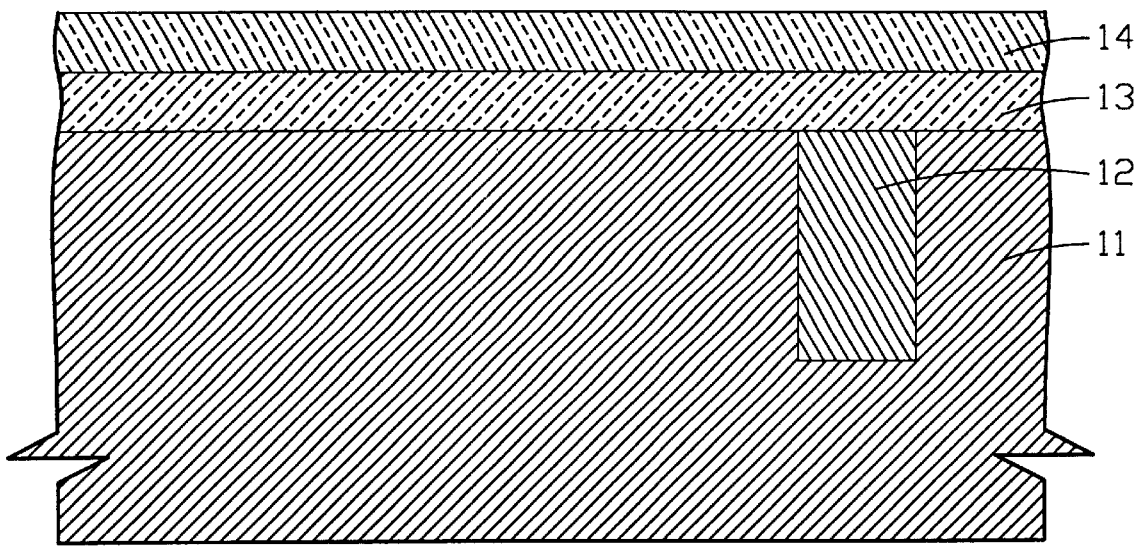

As FIG. 1E, the silicon nitride layer 14, also named as anti-reflection layer is formed using the chemical vapor deposition on the surface of silicon germanium layer 13. The formation temperature of this first silicon nitride layer 14 is about 400° C. to 450° C. and the formation pressure is about few torrs. The depth of the nitride layer 14 is about 300~500 angstroms. The SiN layer and the SiON layer also can be selected as the anti-reflection layer.

Figure 1F:
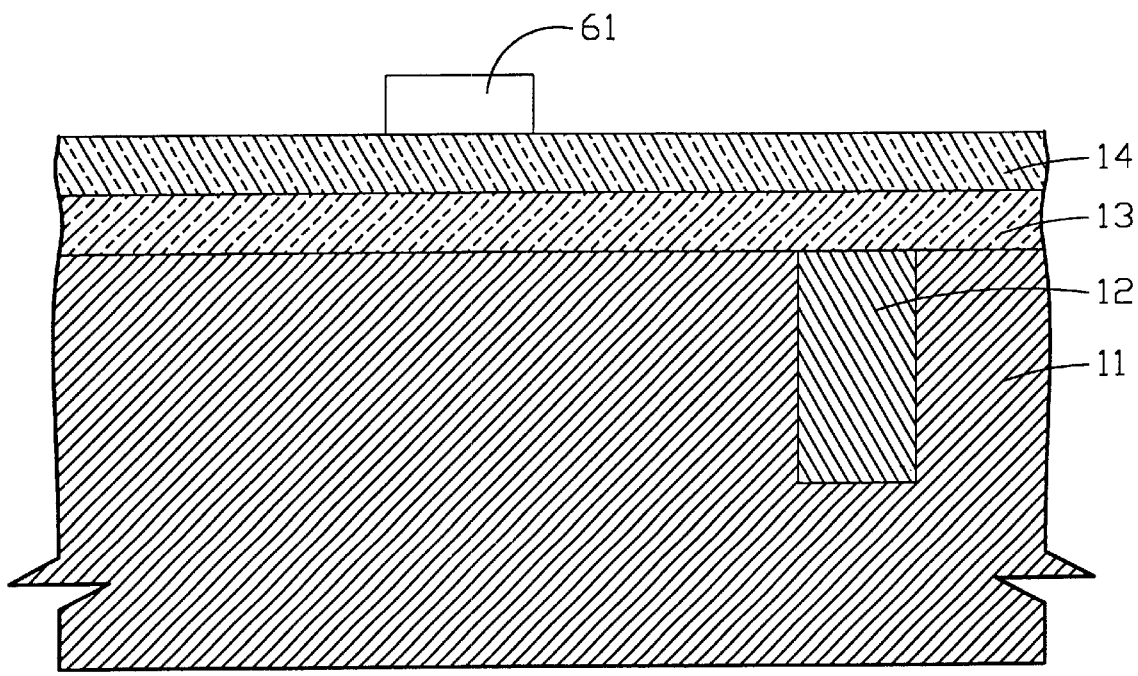

As FIG. 1F, a second photoresist 61 is formed using the conventional photolithography on the surface the silicon nitride layer 14.

Figure 1G:
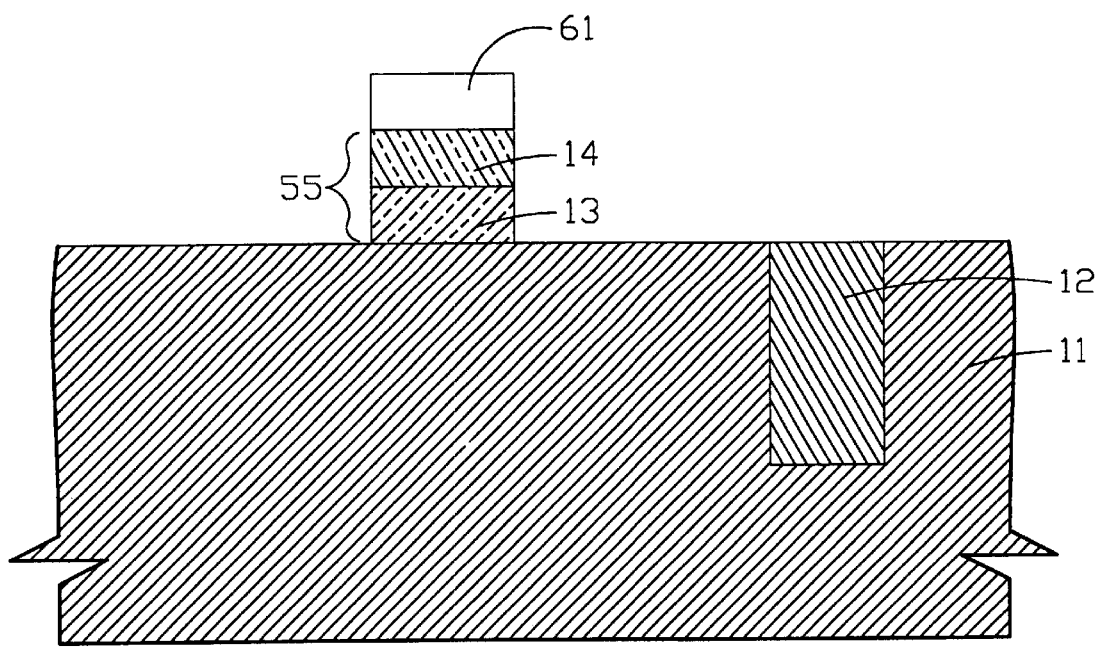

As FIG. 1G, the portions of silicon nitride layer 14 and the portions of silicon germanium layer 13 are etched by the conventional plasma dry etching as a gate region 55.

Figure 1H:
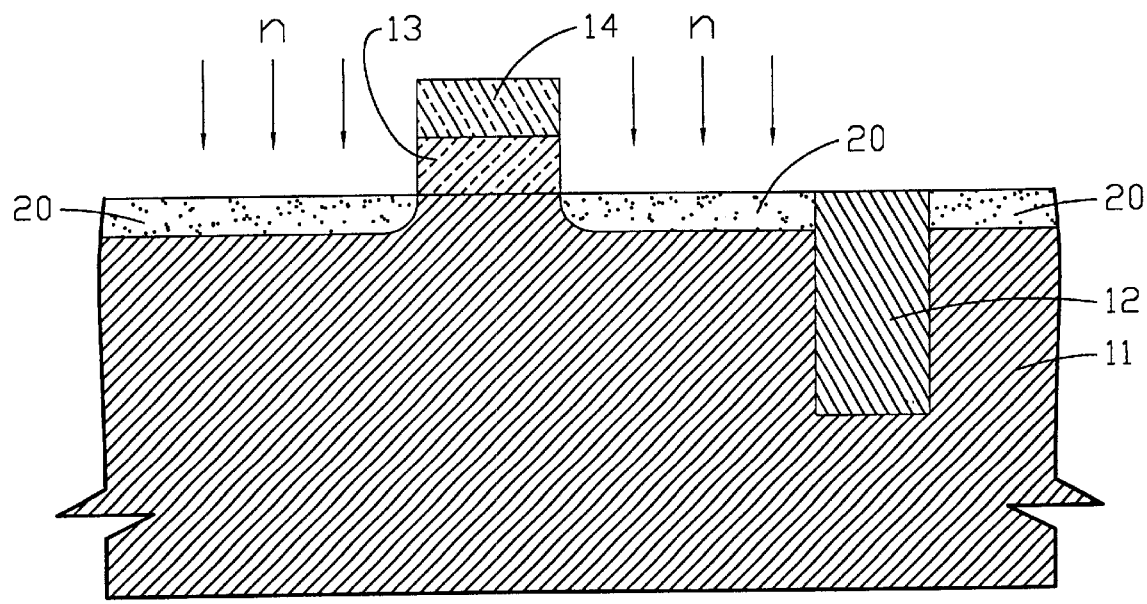

Then, as FIG. 1H, the second photoresist 61 is removed using the conventional plasma dry etching and the source/drain extension such as n-type lightly doped drain 20 is formed. Especially, the formation parameter for this n-type lightly doped drain is about $10^{15}$ ions/cm$^2$.

Figure 1I:
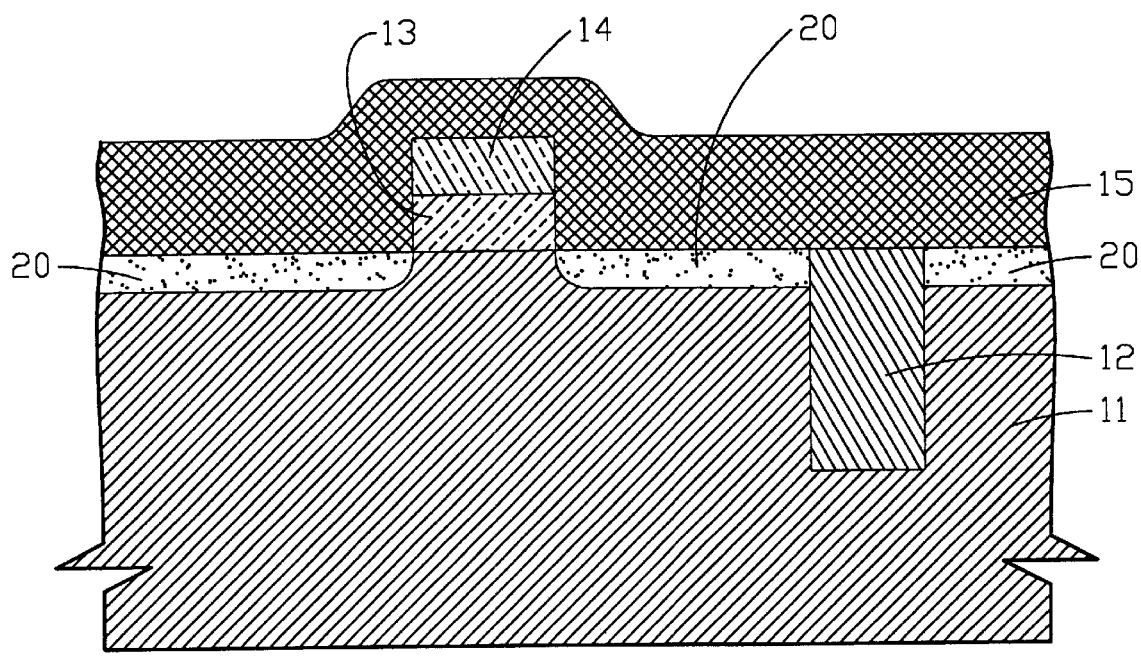

As FIG. 1I, a second silicon dioxide layer 15 is deposited over the surface of semiconductor substrate 11 and the surface of second silicon dioxide layer 15 by using the conventional chemical vapor deposition. The formation temperature of this second silicon nitride layer 14 is about 400° C. to 450° C. and the formation pressure is about few torrs.

Figure 1J:
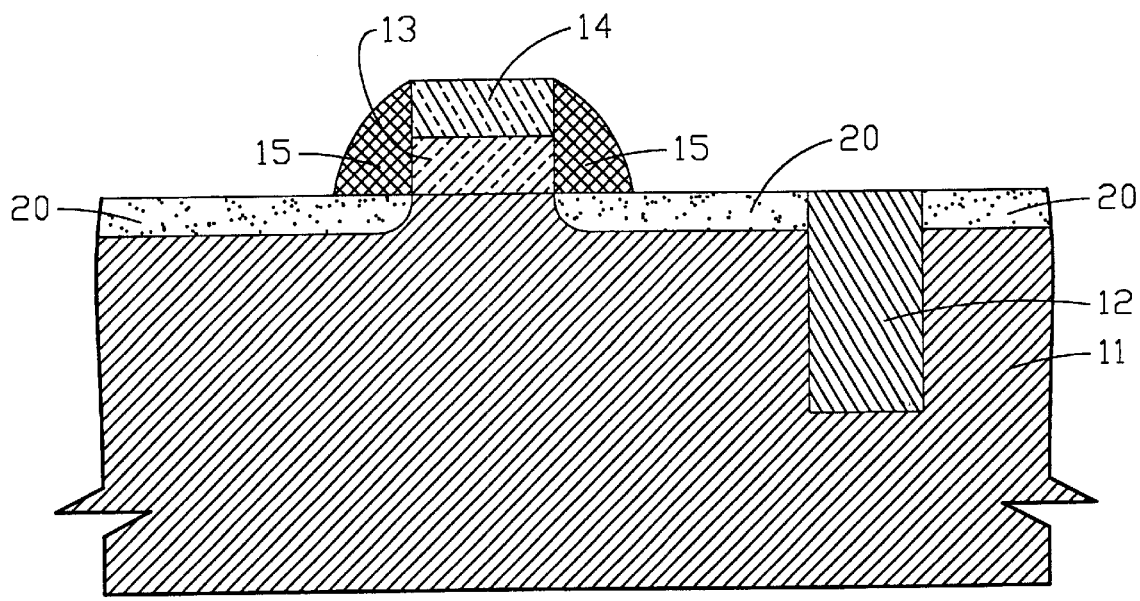

As FIG. 1J, the second silicon dioxide layer 15 is etched using the conventional plasma dry etching as a spacer 15 beside the sidewall of gate region 55.

Figure 1K:
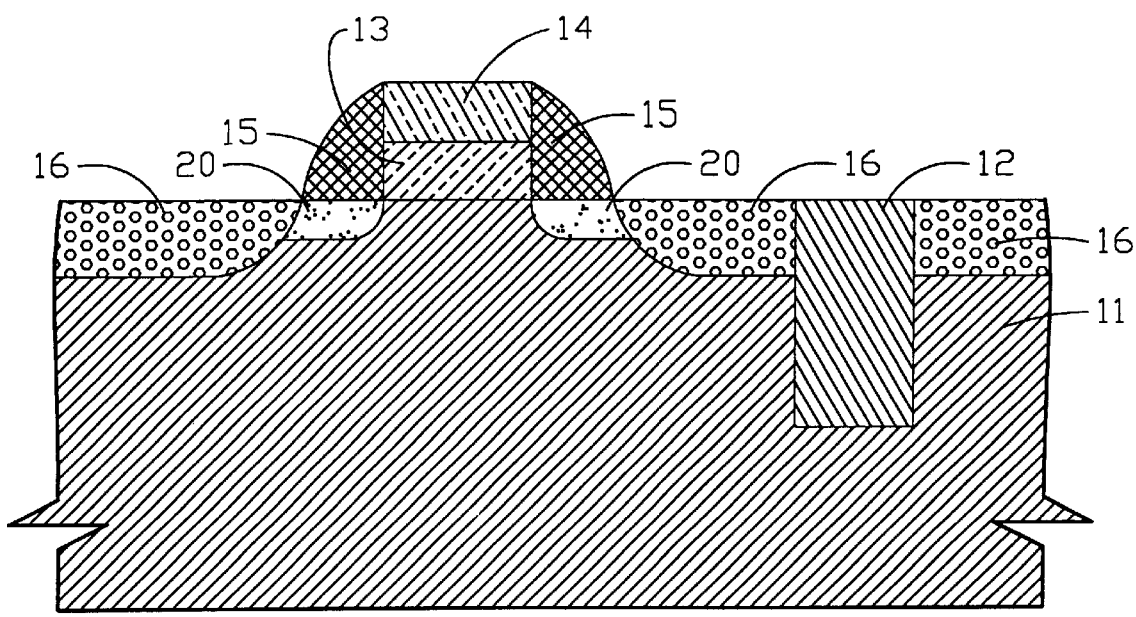

As FIG. 1K, the source/drain region 16 is formed into the semiconductor substrate 11 by the conventional implanting using the gate region and the spacer as a mask. The formation parameter for the source/drain is about $10^{15}$ ions/cm$^2$.

Figure 1L:
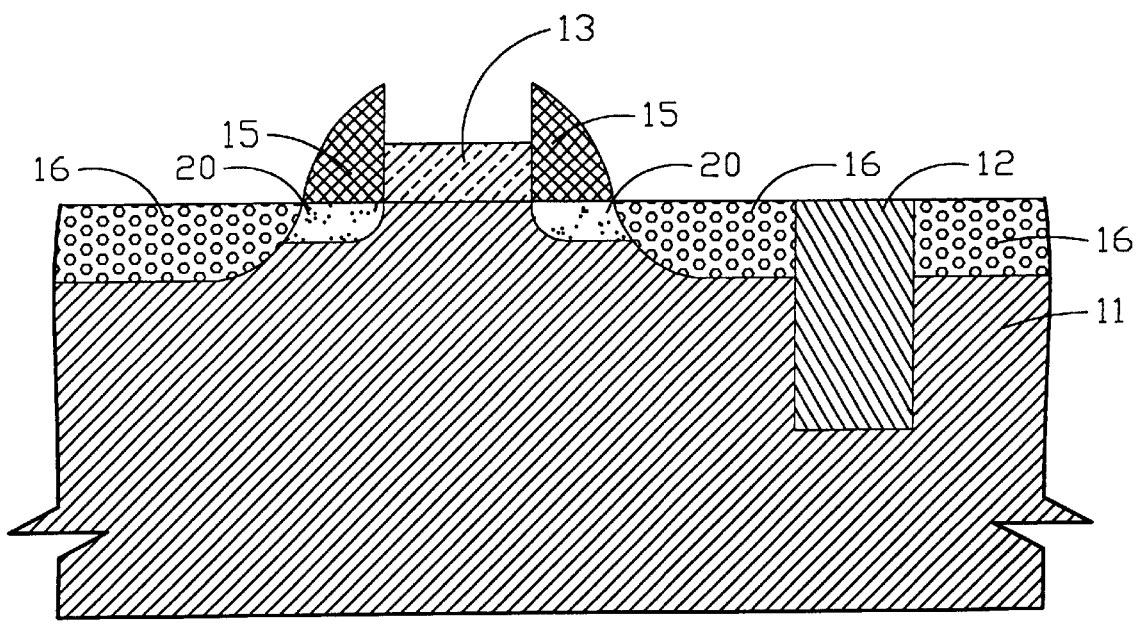

As FIG. 1L, the silicon nitride layer 14 is removed using the conventional plasma dry etching.

Figure 1M:
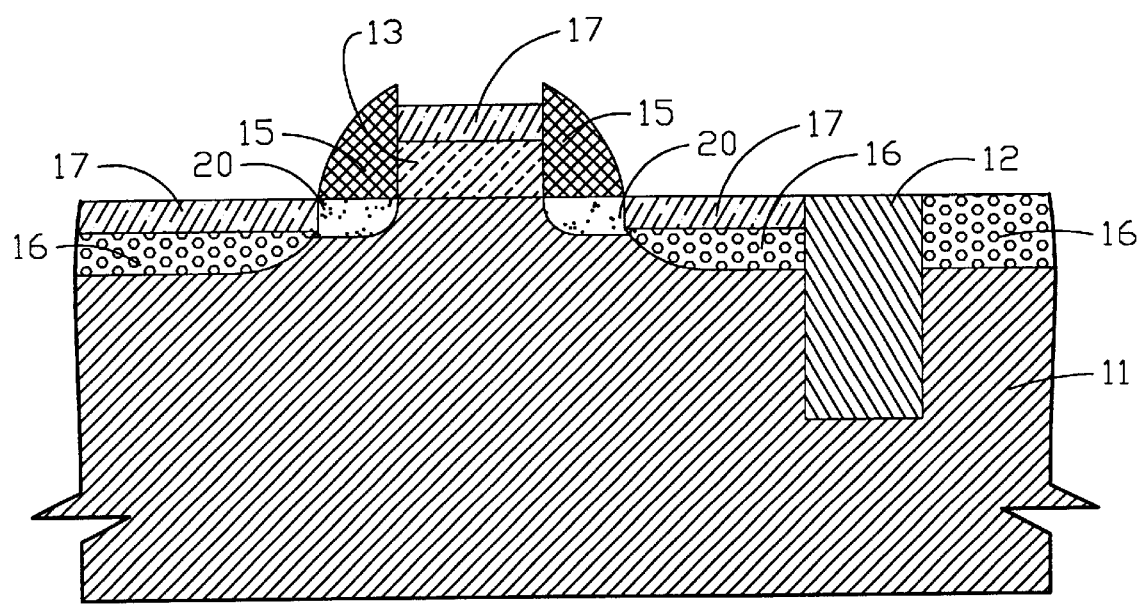

Finally, as FIG. 1M, salicide region 17 is formed into the source/drain region 16 and upon the surface of silicon germanium layer 13 using the conventional chemical vapor deposition to complete the silicon gate structure. The salicide region is normally selected from the group consisting of titanium salicidation and cobalt salicidation. The formation temperature of this salicide region 17 is about 700~900° C. and the formation pressure is about few torrs.

According to the present invention, a method is provided for forming silicon g gate that substantially achieves close-to-midgap work function. In the preferred embodiment, with the disposable silicon nitride film which can be removed, pure p$^+$ doped single gate can be obtained without n$^+$ implantation dose compensate problem happened for CMOS device. In the preferred embodiment, the height of polysilicon gate was lower than oxide spacer, good salicidation can be formed for polysilicon gate, by the way, source/drain to gate bridging for salicidation can be suppressed. In the preferred embodiment, the silicon nitride film can be the anti-reflection layer. Thus, the critical dimension control of polysilicon-gate can be efficiently improved. In the preferred embodiment, the process is compatible with the conventional technology for the sub-0.13 um device design.

Thus, according to the present invention, firstly, a semiconductor substrate is provided. A first photoresist is formed on the surface of semiconductor substrate. The semiconductor substrate is etched to form a concave portion as a shallow trench isolation. The first photoresist is removed. A first silicon dioxide is filled into the shallow trench isolation. A n-type well is formed into the semiconductor substrate. A silicon germanium layer, also named as a doped p-type layer is formed on the surface of semiconductor substrate and the surface of shallow trench isolation. A silicon nitride layer, as a anti-reflection layer is formed on the surface of silicon germanium layer. A second photoresist is formed on the surface the silicon nitride layer. The portions of silicon nitride layer and the portions of silicon germanium layer are etched as a gate region. Then the second photoresist is removed. The source/drain extension is formed. A second silicon dioxide layer is deposited over the surface of semiconductor substrate and the surface of nitride layer. The second silicon dioxide layer is etched as a spacer beside the sidewall of gate region. A source/drain region is formed into the semiconductor substrate by implantation using the gate region and the spacer as a mask. The silicon nitride layer is removed. Finally, salicide region is formed into the source/drain region and upon the surface of silcion layer to complete the silicon gate structure.

Although specific embodiments have been illustrated and described, it will be obvious to those skilled in the art that various modifications may be made without departing from what is intended to be limited solely by the appended claims.

What is claimed is:

1. A method for forming a doped p-type gate with removed anti-reflection layer, comprising:

providing a semiconductor substrate;

etching the semiconductor substrate to form a concave portion for a shallow trench isolation;

filling a first oxide layer into the shallow trench isolation;

forming a n-type well into the semiconductor substrate;

forming a doped p-type layer on the surface of semiconductor substrate and the surface of the shallow trench isolation;

forming the anti-reflection layer on the surface of the doped p-type layer;

etching portions of the anti-reflection layer and portions of the doped p-type layer to form a gate region;

forming a source/drain extension by implantation;

depositing a second oxide layer over the surface of the semiconductor substrate and the surface of the anti-reflection layer;

etching back the second oxide layer to form a spacer beside the sidewall of the gate region;

forming a source/drain region into the semiconductor substrate by implantation using the gate region and the spacer as a mask;

removing the anti-reflection layer; and forming salicide regions into the source/drain region and upon the surface of the doped p-type layer.

2. The method according to claim 1, wherein said first oxide layer comprises silicon dioxide.

3. The method according to claim 1, wherein the depth of said doped p-type layer is about 1000~2000 angstroms.

4. The method according to claim 1, wherein said anti-reflection layer is selected from the group consisting of SiN, SiON and SiC layer.

5. The method according to claim 1, wherein the depth of said anti-reflection layer is about 300~500 angstroms.

6. The method according to claim 1, wherein said forming the source/drain extension comprises doped drain with concentration less than the source/drain region.

7. The method according to claim 1, wherein said second oxide layer comprises silicon dioxide layer.

8. The method according to claim 1, wherein said salicide region is selected from the group consisting of titanium salicidation and cobalt salicidation.

9. A method for forming a doped p-type gate with removed anti-reflection layer, comprising:

providing a semiconductor substrate;

forming a first photoresist on the surface of semiconductor substrate;

etching the semiconductor substrate to form a concave portion for a shallow trench isolation;

removing the first photoresist;

filling a first silicon dioxide into the shallow trench isolation;

forming a n-type well into the semiconductor substrate;

forming a doped p-type layer on the surface of semiconductor substrate and the surface of the shallow trench isolation;

forming an anti-reflection layer on the surface of the doped p-type layer;

forming a second photoresist layer on the surface of the anti-reflection layer;

etching portions of the anti-reflection layer and portion of the doped p-type layer to form a gate region;

removing the second photoresist;

forming a source/drain extension by implantation;

depositing a second silicon dioxide layer over the surface of the semiconductor substrate and the surface of the anti-reflection layer;

etching back the second silicon dioxide layer to form a spacer beside the sidewall of the gate region;

forming a source/drain region into the semiconductor substrate by implantation using the gate region and the spacer as a mask;

removing the anti-reflection layer; and forming salicide regions into the source/drain region and upon the surface of the doped p-type layer.

10. The method according to claim 9, wherein the depth of said doped p-type layer is about 1000~2000 angstroms.

11. The method according to claim 9, wherein said anti-reflection layer is selected from the group consisting of SiN, SiON and SiC layer.

12. The method according to claim 9, wherein the depth of said anti-reflection layer is about 300~500 angstroms.

13. The method according to claim 9, wherein said forming the source/drain extension comprises doped drain with concentration less than the source/drain region.

14. The method according to claim 9, wherein said salicide region is selected from the group consisting of titanium salicidation and cobalt salicidation.

15. The method according to claim 9, wherein the doped p-type layer comprises a silicon germanium layer.

* * * * *